United States Patent
Flanigan

[11] Patent Number: 5,863,396
[45] Date of Patent: Jan. 26, 1999

[54] METHOD AND APPARATUS FOR FABRICATING A WAFER SPACING MASK ON A SUBSTRATE SUPPORT CHUCK

[75] Inventor: Allen Flanigan, San Jose, Calif.

[73] Assignee: Applied Materials, Inc., Santa Clara, Calif.

[21] Appl. No.: 736,887

[22] Filed: Oct. 25, 1996

[51] Int. Cl.$^6$ .................................................. C23C 14/34
[52] U.S. Cl. ..................... 204/298.11; 118/720; 118/721; 118/504; 118/505; 427/282
[58] Field of Search ....................... 204/298.11; 118/720, 118/721, 504, 505; 156/345; 427/282

[56] References Cited

U.S. PATENT DOCUMENTS

| | | | |
|---|---|---|---|
| 4,704,306 | 11/1987 | Nakamura | 427/100 |
| 4,830,723 | 5/1989 | Galvagni et al. | 204/192.17 |
| 4,988,424 | 1/1991 | Woodward et al. | 204/129.29 |
| 5,154,797 | 10/1992 | Blomquist et al. | 156/644 |
| 5,223,108 | 6/1993 | Hurwitt | 204/192.12 |
| 5,380,558 | 1/1995 | Fujino | 204/298.11 |
| 5,405,652 | 4/1995 | Kashiwagi et al. | 204/298.11 |

*Primary Examiner*—Nam Nguyen
*Assistant Examiner*—Rodney G. McDonald
*Attorney, Agent, or Firm*—Thomason & Moser

[57] ABSTRACT

A method and apparatus for fabricating a wafer spacing mask on a workpiece support chuck. Such apparatus is a plate containing a plurality of apertures that is positioned atop the workpiece support chuck while material is deposited onto the plate and through the apertures onto chuck. Upon completion of the deposition process, the plate is removed from the workpiece support chuck leaving deposits of the material to form the wafer spacing mask.

10 Claims, 3 Drawing Sheets

METHOD AND APPARATUS FOR FABRICATING A WAFER SPACING MASK ON A SUBSTRATE SUPPORT CHUCK

CROSS-REFERENCE TO A RELATED APPLICATION

This application is related to copending U.S. patent application Ser. No. 08/612,652, filed Mar. 8, 1996, commonly assigned with the present invention.

BACKGROUND OF THE DISCLOSURE

1. Field of the Invention

The invention relates to a sputter mask used to control deposition of material in a physical vapor deposition (PVD) system. More particularly, the invention relates to a method and apparatus for precise deposition of target material on the surface of a substrate support chuck using a PVD system to fabricate a wafer spacing mask.

2. Description of the Background Art

Substrate support chucks are widely used to support substrates within semiconductor processing systems. A particular type of chuck is a ceramic electrostatic chuck that is used in high-temperature semiconductor processing systems such as high-temperature physical vapor deposition (PVD). These chucks are used to retain semiconductor wafers, or other workpieces, in a stationary position during processing. Such electrostatic chucks contain one or more electrodes imbedded within a ceramic chuck body. The ceramic material is typically aluminum-nitride or alumina doped with a metal oxide such as titanium oxide ($TiO_2$) or some other ceramic material with similar resistive properties. This form of ceramic is partially conductive at high temperatures.

In the traditional use of ceramic electrostatic chucks, a wafer rests flush against the surface of the chuck body as a chucking voltage is applied to the electrodes. Because of the conductive nature of the ceramic material at high temperatures, the wafer is primarily retained against the ceramic support surface by the Johnsen-Rahbek effect. Such a chuck is disclosed in U.S. Pat. No. 5,117,121 issued May 26, 1992.

One disadvantage of using a chuck body fabricated from ceramic is that, during manufacture of the support, the ceramic material is "lapped" to produce a relatively smooth surface. Such lapping produces particles that adhere to the surface of the support. These particles are very difficult to completely remove from the surface. The lapping process may also fracture the surface of the chuck body. Consequently, as the chuck is used, particles are continuously produced by these fractures. Additionally, during wafer processing, the ceramic material can abrade the wafer oxide from the underside of the wafer resulting in further introduction of particulate contaminants to the process environment. During use of the chuck, the particles can adhere themselves to the underside of the wafer and be carried to other process chambers or cause defects in the circuitry fabricated upon the wafer. It has been found that tens of thousands of contaminant particles can adhere to the backside of a given wafer after retention upon a ceramic electrostatic chuck.

Similarly, substrate support chucks that are used in low-temperature processing (e.g., less than 300 degrees Celsius) may also produce contaminant particles that interfere with the wafer processing. Such low-temperature chucks include electrostatic chucks and mechanical clamping chucks which contain wafer support surfaces that are typically fabricated from dielectric materials such as alumina. These types of chucks have also been found to produce particular contaminants during use that can adhere to the underside of the wafer during processing.

To overcome the disadvantages associated with the workpiece substrate contacting the substrate support chuck, a wafer spacing mask is deposited upon the surface of the substrate support chuck. Such a wafer spacing mask is disclosed in commonly assigned U.S. patent application Ser. No. 08/612,652, filed Mar. 8, 1996 entitled "Wafer Spacing Mask for a Substrate Support Chuck And Method Of Fabricating Same." The material deposited upon the support surface of the chuck body, i.e., the wafer spacing mask, is a metal such as titanium, titanium nitride, stainless steel and the like. Other materials, including conductors, insulators and semiconductors, that have superior contact properties can also be used to fabricate the spacing mask. Additionally, a mask may comprise combinations of materials, e.g., a metallic layer supported by an insulator layer and the like. The material supports a semiconductor wafer in such a way that the surface of the wafer that faces the chuck is spaced-apart and substantially parallel to the surface of the chuck. Usually the material is deposited to form a plurality of pads, although any wafer spacing mask pattern deposited on the surface of the substrate support chuck may be used. Thus, the wafer spacing mask reduces the amount of contaminant particles that adhere to the underside of the wafer. Heretofore, there was not available a repeatable technique for fabricating such a wafer spacing mask.

Therefore, a need exists in the art for a method and apparatus for fabricating a wafer spacing mask.

SUMMARY OF THE INVENTION

The disadvantages heretofore associated with the prior art are overcome by a method and apparatus for fabricating a wafer spacing mask on a substrate support chuck. Specifically, the invention is a sputter mask or stencil used in a deposition process to form the wafer spacing mask on the substrate support chuck.

The wafer spacing mask is fabricated on the support surface of the chuck by masking the support surface using a plate. The plate contains a plurality of apertures that, during one or more deposition processes, permit material to be deposited on the plate and the exposed surface of the substrate support. Upon completion of the deposition process, the plate is removed from the surface of the substrate support leaving defined deposits of the deposition material or materials.

An additional feature of the sputter mask is the use of countersink shaped (funnel shaped) apertures having counterbores surrounding the narrow openings of the countersink aperture. The counterbores ensure a uniform deposit of material onto the chuck having convex (domed) surfaces.

BRIEF DESCRIPTION OF THE DRAWINGS

The teachings of the present invention can be readily understood by considering the following detailed description in conjunction with accompanying drawings, in which.

DETAILED DESCRIPTION

Figure 1:
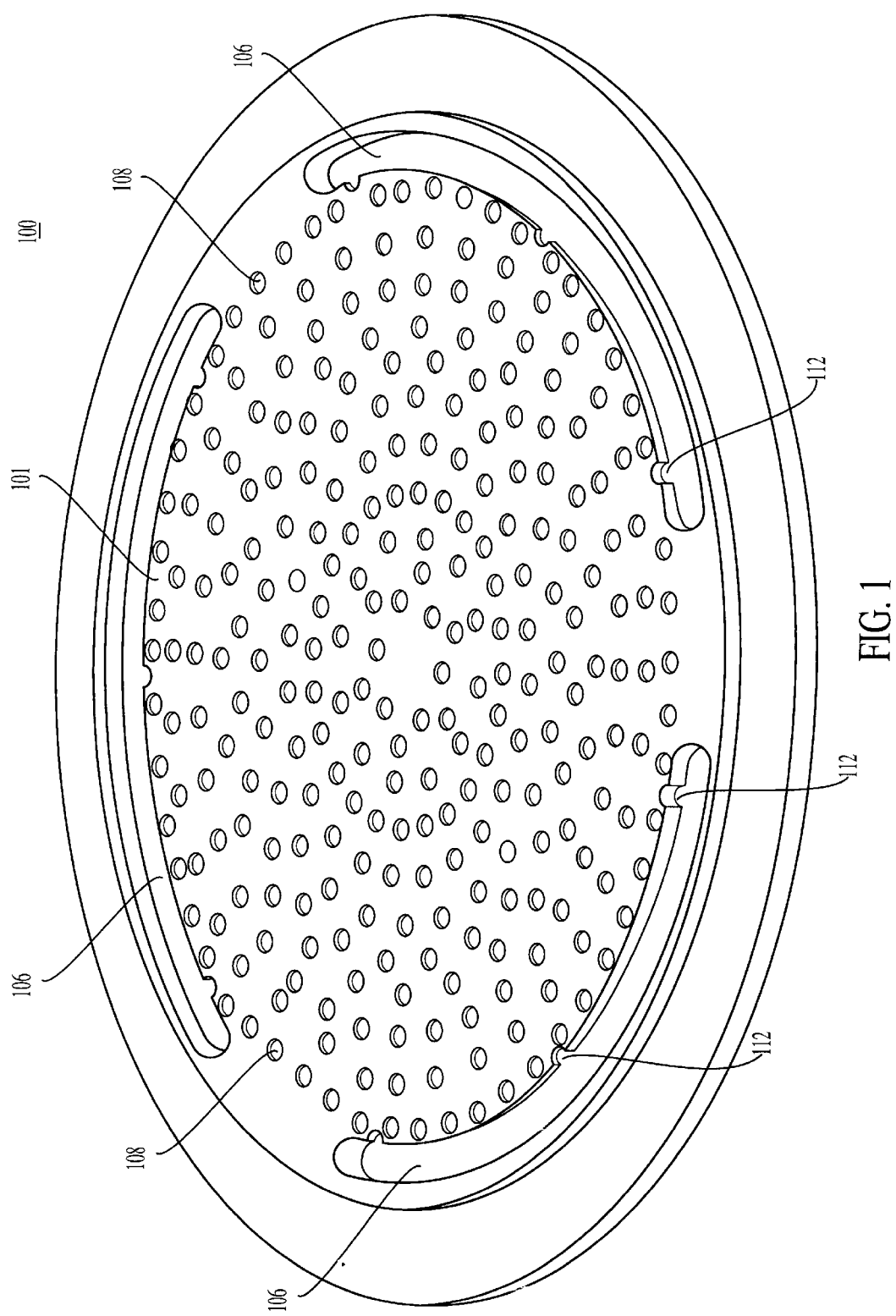
FIG. 1 depicts a perspective view of the sputter mask of the present invention.
Figure 2:
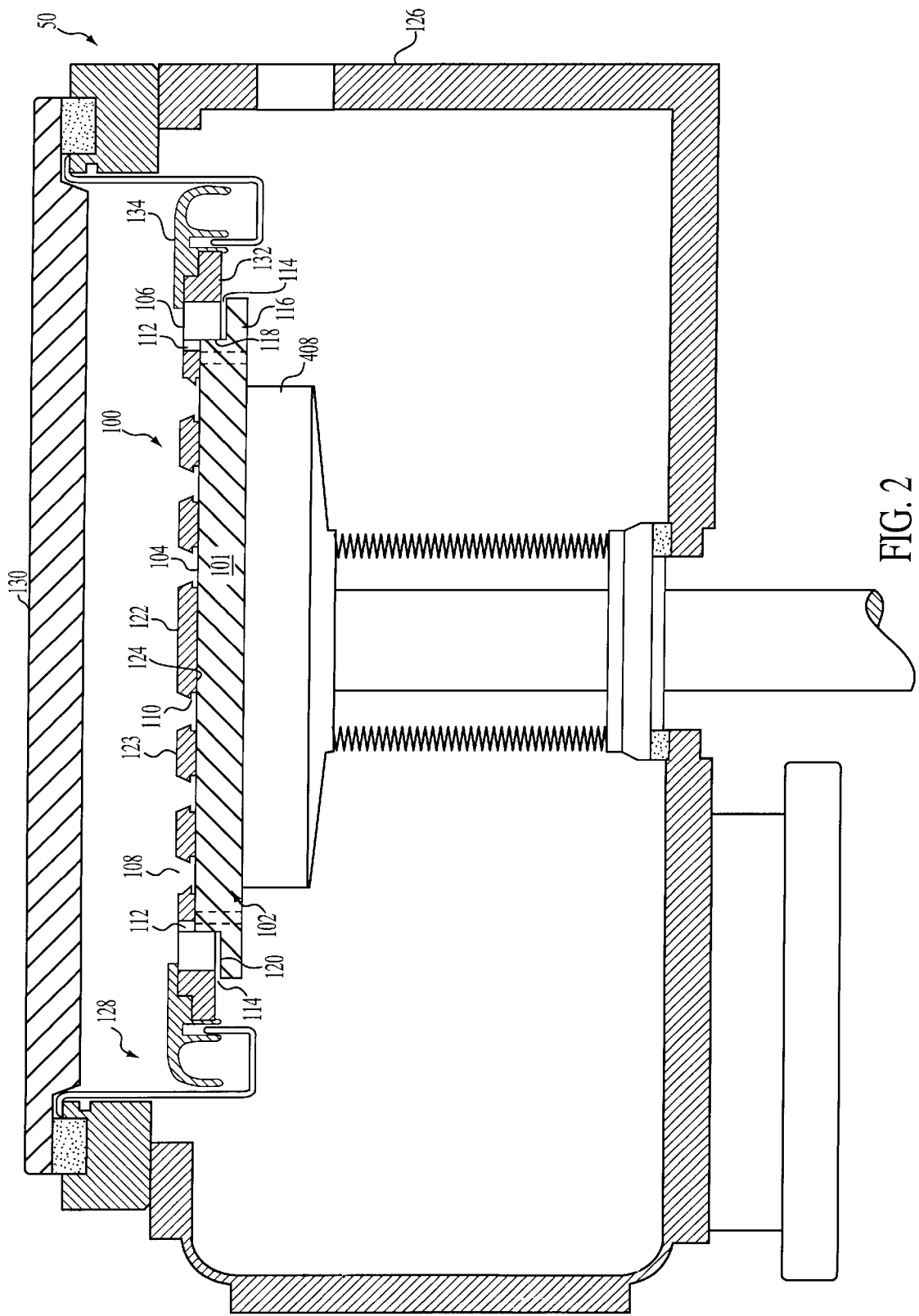
FIG. 2 depicts a cross-sectional view of the sputter mask positioned on the surface of a substrate support chuck within a physical vapor deposition system.

FIG. 1 depicts a perspective view of the sputter mask or stencil 100. To illustrate the use of the invention, FIG. 2 depicts a vertical cross-sectional view of the apparatus of FIG. 1, positioned on the surface 104 of a substrate support chuck 102 within a physical vapor deposition (PVD) system 50. The cross-sectional view in FIG. 2 is simplified and not drawn to scale so that the apertures are shown in detail. For best understanding of the invention, the reader should simultaneously refer to both FIGS. 1 and 2 while reading the following disclosure.

Specifically, the sputter mask 100 contains peripheral slots 106, and a plurality of apertures 108. Each slot 106 contains one or more offset apertures 112. The sputter mask 100 as shown in the embodiment of FIG. 1 has three slots 106, each with three offset apertures 112, and 270 apertures 108.

The specific shape of the sputter mask depends on the shape of the substrate support chuck 102. Typically, a substrate support chuck 102 is circular in plan form, matching the shape of a typical semiconductor wafer. The substrate support is generally supported upon apparatus 408 for heating, cooling and retaining a workpiece or substrate upon the surface of the substrate support. To retain a workpiece on the chuck surface, the chuck may contain elements for electrostatically clamping the workpiece or mechanically clamping the workpiece. The invention is applicable to any chuck type. Therefore, the specific nature of the chuck and its operation is irrelevant to the invention.

The sputter mask 100 is shaped such that when it is placed on the surface of the substrate support, the underside surface 124 of the sputter mask is supported by the surface 104 of the chuck 102. In the depicted embodiment, the substrate support chuck 102 contains a flange 116 that extends radially from the central body 101 of the chuck circumscribes the entire central body 101. As such, the circumferential edge 118 of the chuck body 101 is used to center the mask upon the chuck 102. Although the mask rests upon the chuck surface 104, there are areas of the sputter mask that do not contact the surface of the substrate support. In particular, the sputter mask does not contact the surface 120 of the flange 116. A gap 114 is formed between the flange of the substrate support and the sputter mask 100. The sputter mask extends beyond the edge of the flange 116 of the support surface to form an overhang 132. In use, this overhang supports a conventional cover ring 134.

The slots 106 abut the edge 118 of the chuck body 101 such that deposition material will adhere to the surface 120 of flange 116. The offsets 112 allow for deposits that lie on the surface 104 of the chuck to be connected to the deposits in the slots 106, i.e., material is deposited over edge 118 to interconnect material deposited in the offset 112 with material deposited in the slot 106.

Alternatively, the plurality of slots 106 can be replaced with a single circumferential slot or gap. As such, the sputter mask would contain two separate portions: (1) a central portion for masking the support surface of the chuck; and (2) a ring portion for masking the flange 116. To align the central portion with the chuck surface, alignment pins extend into surface features of the chuck such as backside gas distribution ports or lift pin holes and the like. The ring portion rests upon the flange and would contain a notch or edge extension to ensure coaxial alignment with the flange.

The sputter mask contains approximately 270 apertures 108 that are arrayed, for example, in a pattern of concentric rings. Each aperture 108, has the form of a countersunk hole or bore (a funnel shape) with the larger opening of the countersunk hole on the upper surface 123 of the sputter mask 100. Each aperture also contains a counterbore 110 that is coaxially aligned with the countersunk hole and located in the bottom surface 124 of the sputter mask. Illustratively, each countersunk hole has a large diameter of approximately 0.164 inches (4.2 mm), an angle of approximately 82 degrees and a small diameter of approximately 0.060 inches (1.5 mm) deep. Opposite each countersunk hole is a counterbore having a diameter of approximately 0.090 inches (2.3 mm) and a depth of 0.008 inches (0.2 mm). Many other sizes and arrangements of apertures are available and all such variations are considered within the scope of the present invention.

Typically, the material of the sputter mask is titanium. Other materials can be used such as silicon, ceramic, aluminum, aluminum nitride and the like. The choice of material depends on the type of system the sputter mask will be used in. For example, in PVD systems, materials that minimize differential thermal expansion such as titanium are the most desirable materials for the sputter mask. Another consideration in choosing sputter mask material is the material that will be sputtered in the system to form deposits on the surface of the substrate support. For example, it is impossible to clean and reuse a titanium mask that has been sputtered with titanium. Therefore, if a reusable mask is desirable, the mask should be fabricated from a different material than that which is being sputtered, e.g., a silicon mask for sputtering titanium.

The method of forming deposits on the surface 104 of the substrate support chuck 102 begins with placement of the sputter mask 100 onto the substrate support surface within a PVD system 50. In addition to the chuck 102, the PVD system conventionally contains an enclosure 126 (vacuum chamber) containing a vacuum, a cover ring assembly 128 for confining the deposition proximate the chuck, and a target 130. The PVD system is a conventional system that is operated in a conventional manner to cause sputtering of the target material upon the sputter mask and the exposed support surface of the chuck. The deposition material is a material that bonds to and is thermally compatible with the chuck material. For example, for ceramic chucks, deposition materials include boron-nitride, diamond, oxides, such as aluminum-oxide, and metals such as titanium. In general, this technique for patterned deposition of materials is known as lift-off deposition.

To fabricate a sufficient wafer support mask, the PVD system deposits a 1 micron layer of material on the substrate support while the sputter mask 100 is positioned on the support surface 104 of the chuck 102. Deposition material passes through the apertures of the sputter mask onto the surface of the substrate support. Additionally, a second layer of material may be deposited over the first layer such that an insulator may be first deposited and a conductor deposited thereover. Any number of layers comprising various materials can be deposited using the inventive sputter mask. Following the deposition, the target is removed from the chamber such that the sputter mask can be removed from the chuck surface through the top of the PVD system enclosure. The result is a pattern of deposition material atop the chuck surface 104 and the flange surface 120.

Figure 3:
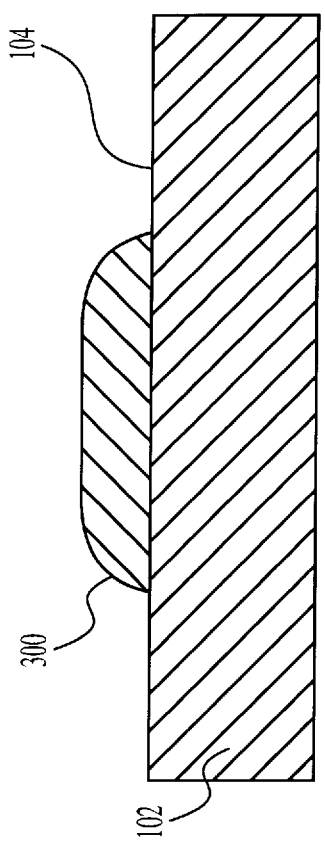
FIG. 3 depicts a vertical cross-sectional view of a resulting deposit of target material on the surface of the substrate support chuck.

The combination of the countersunk holes and the counterbores ensures a uniform deposit of material during the deposition process. Specifically, FIG. 3 depicts a vertical cross-sectional view of a resulting deposit 300 of target material on the surface 104 of the substrate support chuck 102. The counterbores prevent sticking of the sputter mask to the deposited material and provide material deposits having convex (domed) surfaces. Also, the countersunk apertures increase deposition rate by providing a wide aperture to permit deposition of material at a wide range of trajectory angles for the deposition material particles.

Although various embodiments which incorporate the teachings of the present invention have been shown and described in detail herein, those skilled in the art can readily devise many other varied embodiments that still incorporate those teachings.

What is claimed is:

1. Apparatus for masking a support surface of a workpiece support chuck, comprising:

a plate, sized to cover said support surface, said plate having a first side and a second side, said plate further having a plurality of apertures that extend through said plate from said first side to said second side, said plate being shared such that said second side rests upon said support surface of said workpiece support chuck during deposition of material through said apertures and onto said support surface to form a wafer spacing mask thereupon.

2. The apparatus of claim 1 wherein said apertures are centrally located in said plate and said plate further comprises:

at least one slot, positioned between the apertures and an edge of the plate.

3. The apparatus of claim 2 wherein said slot has at least one offset aperture located in an edge of said slot and oriented towards the centrally located apertures in the plate.

4. The apparatus of claim 1 wherein said plate is sized to cover and extend beyond an edge of said support surface to form an overhang that interacts with a circumferential flange extending from the edge of the workpiece support chuck to align said plate with the workpiece support chuck.

5. The apparatus of claim 4 wherein said overhang is adapted to support a deposition ring.

6. The apparatus of claim 1 wherein each aperture contains a countersunk hole.

7. The apparatus of claim 6 wherein said plate further comprises a bottom surface that rests upon the support surface of the workpiece support chuck containing a counterbore coaxially aligned with said countersunk hole.

8. The apparatus of claim 1 wherein said apertures form a pattern of concentric rings of apertures.

9. The apparatus of claim 1 wherein said plate is fabricated of a metallic material.

10. The apparatus of claim 9 wherein said metallic material is titanium.

* * * * *